(12) United States Patent
Suzuki et al.

(10) Patent No.: US 7,232,233 B2
(45) Date of Patent: Jun. 19, 2007

(54) CATOPTRIC REDUCTION PROJECTION OPTICAL SYSTEM AND EXPOSURE APPARATUS USING THE SAME

(75) Inventors: Masayuki Suzuki, Tochigi (JP); Chiaki Terasawa, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/207,938

(22) Filed: Jul. 29, 2002

(65) Prior Publication Data

US 2003/0063375 A1    Apr. 3, 2003

(30) Foreign Application Priority Data

Jul. 31, 2001    (JP)    ............... 2001-230957

(51) Int. Cl.
  *G02B 5/10* (2006.01)
(52) U.S. Cl. ............... 359/859; 359/850; 359/857; 359/858; 359/861
(58) Field of Classification Search ............... 359/850, 359/857–859, 861, 356; 378/34, 35, 85
See application file for complete search history.

(56) References Cited

U.S. PATENT DOCUMENTS

| | | | | |
|---|---|---|---|---|
| 5,815,310 A | * | 9/1998 | Williamson | ............... 359/365 |
| 6,033,079 A | * | 3/2000 | Hudyma | ............... 359/857 |
| 6,172,825 B1 | * | 1/2001 | Takahashi | ............... 359/859 |
| 6,195,201 B1 | * | 2/2001 | Koch et al. | ............... 359/366 |
| 6,199,991 B1 | * | 3/2001 | Braat | ............... 359/856 |
| 6,255,661 B1 | * | 7/2001 | Braat | ............... 250/492.2 |
| 6,299,318 B1 | | 10/2001 | Braat | |
| 6,359,678 B1 | | 3/2002 | Ota | |
| 6,386,715 B2 | | 5/2002 | Braat | |
| 6,556,648 B1 | * | 4/2003 | Bal et al. | ............... 378/34 |
| 2002/0175300 A1 | | 11/2002 | Suzuki et al. | |
| 2002/0176063 A1 | | 11/2002 | Omura | |
| 2002/0176096 A1 | | 11/2002 | Sentoku et al. | |
| 2003/0031017 A1 | | 2/2003 | Tsuji | |

FOREIGN PATENT DOCUMENTS

| | | |
|---|---|---|
| JP | 2000031041 | 1/2000 |
| JP | 200185480 | 7/2001 |
| JP | 2001185480 | 7/2001 |

OTHER PUBLICATIONS

Notice of Reasons for Rejections for Japanese Application No. 2001-230957 issued Sep. 30, 2003 and its English Translation.
Decision of Final Rejection for Japanese Application No. 2001-230957 issued Sep. 28, 2004 and its English Translation.

* cited by examiner

*Primary Examiner*—Stephone B. Allen
*Assistant Examiner*—Joshua L. Pritchett
(74) *Attorney, Agent, or Firm*—Morgan & Finnegan, LLP

(57) ABSTRACT

A catoptric reduction projection optical system that uses light of light with a wavelength of 200 nm or less includes six light-reflecting mirrors arranged from an object side to an image side such that said mirrors basically form a coaxial system, wherein a third mirror in said six mirrors is located at a pupil position of said optical system.

15 Claims, 5 Drawing Sheets

CATOPTRIC REDUCTION PROJECTION OPTICAL SYSTEM AND EXPOSURE APPARATUS USING THE SAME

BACKGROUND OF THE INVENTION

The present invention relates generally to exposure apparatuses, and more particularly to a catoptric reduction projection optical system, an exposure apparatus, and a device fabricating method, the catoptric reduction projection optical system using ultraviolet light such as extreme ultraviolet ("EUV") light to project and expose an object such as a single crystal substrate for a semiconductor wafer (plate or ball), and a glass plate (wafer) for a liquid crystal display (LCD).

Along with the recent demand on smaller and lower profile electronic devices, fine semiconductor devices to be mounted onto these electronic devices have been increasingly demanded. For example, a design rule for a mask pattern requires that an image with a size of a line and space (L&S) of less than 0.1 μm be extensively formed and predictably, it will move to a formation of circuit patterns of less than 80 nm in the near future. L&S denotes an image projected to a wafer in exposure with equal line and space widths, and serves as an index of exposure resolution.

A projection exposure apparatus as a typical exposure apparatus for fabricating semiconductor devices includes a projection optical system that projects and exposes a pattern of a mask or a reticle (which are used interchangeably in the present application) onto a wafer. Resolution R of a projection exposure apparatus (a minimum size which enables a precise transfer of an image) can be given by using a light-source wavelength λ and the numerical aperture (NA) of the projection optical system as in the following equation:

$$R = k_1 \times \frac{\lambda}{NA} \quad (1)$$

Therefore, the shorter the wavelength becomes, and the higher the NA increases, the better the resolution becomes. In recent years, it is required that the resolution be a smaller value and thus, there is a limit in meeting this requirement just by increasing NA. It is thus expected to improve the resolution by shortening the wavelength. Currently, an exposure light source is in transition from a KrF excimer laser (with a wavelength of approximately 248 nm) and an ArF excimer laser (with a wavelength of approximately 193 nm) to an $F_2$ excimer laser (with a wavelength of 157 nm), and practical use of extreme ultraviolet (EUV) light is being promoted as a light source.

As a shorter wavelength of light would limit usable glass materials for transmitting the light, use of reflecting elements, i.e., mirrors for a projection optical system are advantageous instead of using many refracting elements, i.e., lenses. No glass materials are usable for EUV light as exposure light, and thus a projection optical system could not include any lenses. It has thus been proposed to form a projection optical system only with mirrors.

In a catoptric reduction projection optical system, a multilayer film is formed on mirrors so that reflected light may be intensified for a higher reflectance on the mirrors, but it is desirable to use as few mirrors as possible so as to increase its reflectance for the whole optical system. In order to prevent a mechanical interference between the mask and the wafer, the number of mirrors is desirably an even number, the mirrors making up the projection optical system such that the mask and the wafer are located at opposite sides with a pupil in between. A smaller critical dimension (or resolution) for the EUV exposure apparatus than a conventional one requires a large NA (e.g., NA of 0.2 for a wavelength of 13.5 nm), while it is hard for the conventional 3 to 4 mirrors to decrease the wave aberration. For the increased degree of freedom in correcting the wave aberration, the increased number of mirrors are needed as well as making the mirrors aspheric. As a result, the projection optical system comes to require so many as six mirrors (while the instant application calls such an optical system a six-mirror system).

However, the conventional catoptric projection optical system of a six-mirror system has not yet realized a well-balanced reconcilement between the high NA and high imaging performance for the EUV light, and disadvantageously it could not provide high quality devices with good exposure performance such as resolution.

For example, U.S. Pat. No. 5,686,728 discloses an embodiment that uses six aspheric mirrors. This reference points out a defect due to a short wavelength of the EUV projection system, and describes an optical system effective for use with a wavelength ranging from 100 nm to 300 nm such as 126 nm, 146 nm, 157 nm, 172 nm, 193 nm, etc., all of which are longer in wavelength than the EUV light. However, this optical system uses a wavelength one digit larger than the EUV light, and thus the wave aberration becomes one digit larger if applying to EUV. This reference as it is would provide such poor imaging performance that it cannot be applied for the EUV light. U.S. Pat. No. 5,815,310 and Japanese Laid-Open Patent Application No. 2000-235144, etc. disclose a six mirror system having the high NA (e.g., NA of 0.15 to 0.25) for the EUV light, but one of their mirrors in the six-mirror system would cause an interfere (or vignette) with light, possibly deteriorating the imaging performance.

Further, the conventional projection optical system using mirrors is so non-telecentric on an object side that a principal ray of light entering and exiting from the reticle or mask (collectively referred to as "reticle" hereinafter) is inclined greatly to a normal line of the object plane. As a result, relative arrangement between the reticle and the wafer (image plane) offsets in the optical axis direction during the scan exposure operation would change the imaging reduction on the wafer, deteriorating the imaging performance.

BRIEF SUMMARY OF THE INVENTION

Accordingly, it is an exemplified object of the present invention to provide a six-mirror catoptric reduction projection optical system and an exposure apparatus using the same, which may provide well-balanced reconcilement between the high NA applicable to EUV lithography and imaging performance.

A catoptric reduction projection optical system that uses light with a wavelength of 200 nm or less includes six mirrors arranged from an object side to an image side such that said mirrors basically form a coaxial system, wherein a third mirror in the six mirrors is located at a pupil position of the optical system. This catoptric reduction projection optical system may increase the NA using the six-mirror system, and avoid vignetting by providing the third mirror at the pupil position. As the inventive optical system has the third mirror at the pupil position, it provides a small slant of a principal ray to the object plane. Accordingly, the inventive catoptric reduction projection optical system may achieve an optical system with the high NA and excellent imaging performance due to a small change in image size even when the object plane shifts in the optical axis direction while preventing the interference between a ray and a mirror.

A catoptric reduction projection optical system that uses light with a wavelength of 200 nm or less includes six mirrors arranged from an object side to an image side such that the mirrors basically form a coaxial system, wherein a principal ray of light from the object plane is inclined by less than 7.3 degrees in a direction perpendicular to an object plane of the optical system. According to this catoptric reduction projection optical system, the slant of the principal ray from the object plane is 7.3 degrees, i.e., it is an approximately telecentric optical system at the object side, and thus, a change in image size is small even if the object plane shifts in the optical axis direction. Such an optical system is a six-mirror system, and can provide the high NA as the above catoptric reduction projection optical system. The catoptric reduction projection optical system of the instant invention, which has little change in imaging reduction, can achieve an optical system excellent in imaging performance, having a high NA. In such an optical system, the slant is preferably six degrees or less, or more preferably three degrees or less. The third mirror of the six mirrors may be located at a pupil position of the optical system, and perform an operation similar to that of the above catoptric reduction projection optical system.

In the above catoptric reduction projection optical system, the pupil is located at an aperture stop. In the above catoptric reduction projection optical system, the six mirrors may include in order from an object side to an image side a concave mirror, a convex mirror, a convex mirror, a concave mirror, a convex mirror, and a concave mirror. This power arrangement is preferred in the above optical system. The catoptric reduction projection optical system may form an intermediate image between fourth and fifth mirrors in the six mirrors. This optical system may provide an excellent well-balanced aberration correction. At least one of the six mirrors may be an aspheric mirror having a multilayer film for correcting aberration. The six mirrors may be all aspheric mirrors having a multilayer film. Light from a light source is extreme ultraviolet light with a wavelength of 20 nm or less, which is a suitable for optical system in a short wavelength. The catoptric reduction projection optical system may project a pattern on a catoptric mask or reticle, or a transmittance type mask or reticle, provided on the object plane. The catoptric reduction projection optical system according to the instant invention may apply both a catoptric mask or reticle and a transmittance type reticle.

An exposure apparatus as another aspect of the present invention includes the above projection optical systems, and an illumination optical system that illuminates the reticle by an extreme ultraviolet light corresponding to a circular arc shaped field of the projection optical system. This exposure apparatus includes the above projection optical system, thus having an excellent exposure performance such as resolution.

A device fabricating method as another aspect of the present invention includes the steps of exposing a plate by using the above exposure apparatus, and performing a specified process on the exposed plate. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
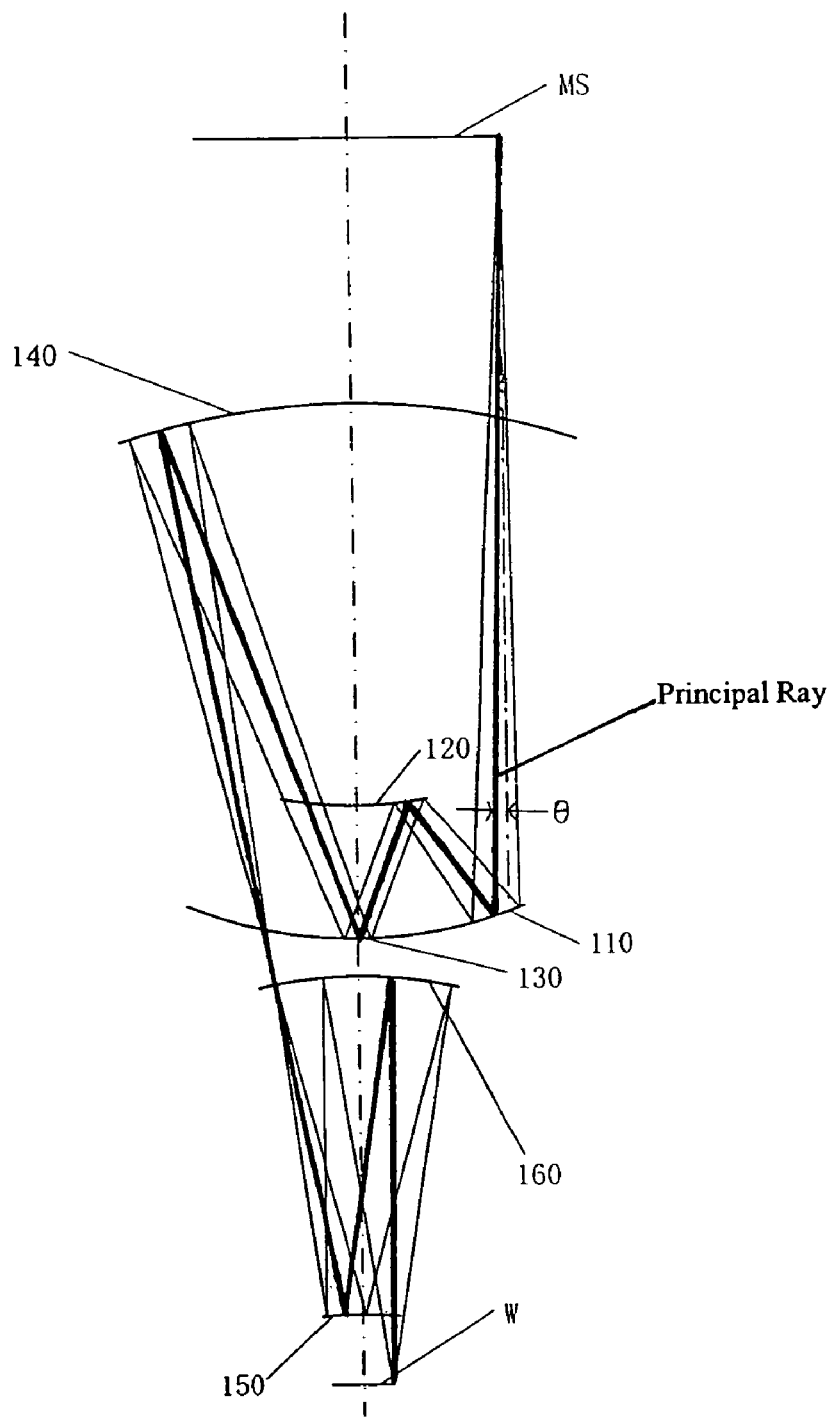
FIG. 1 is a schematic sectional view showing an exemplary shape of a catoptric reduction projection optical system as one aspect of the present invention and its optical path.
Figure 2:
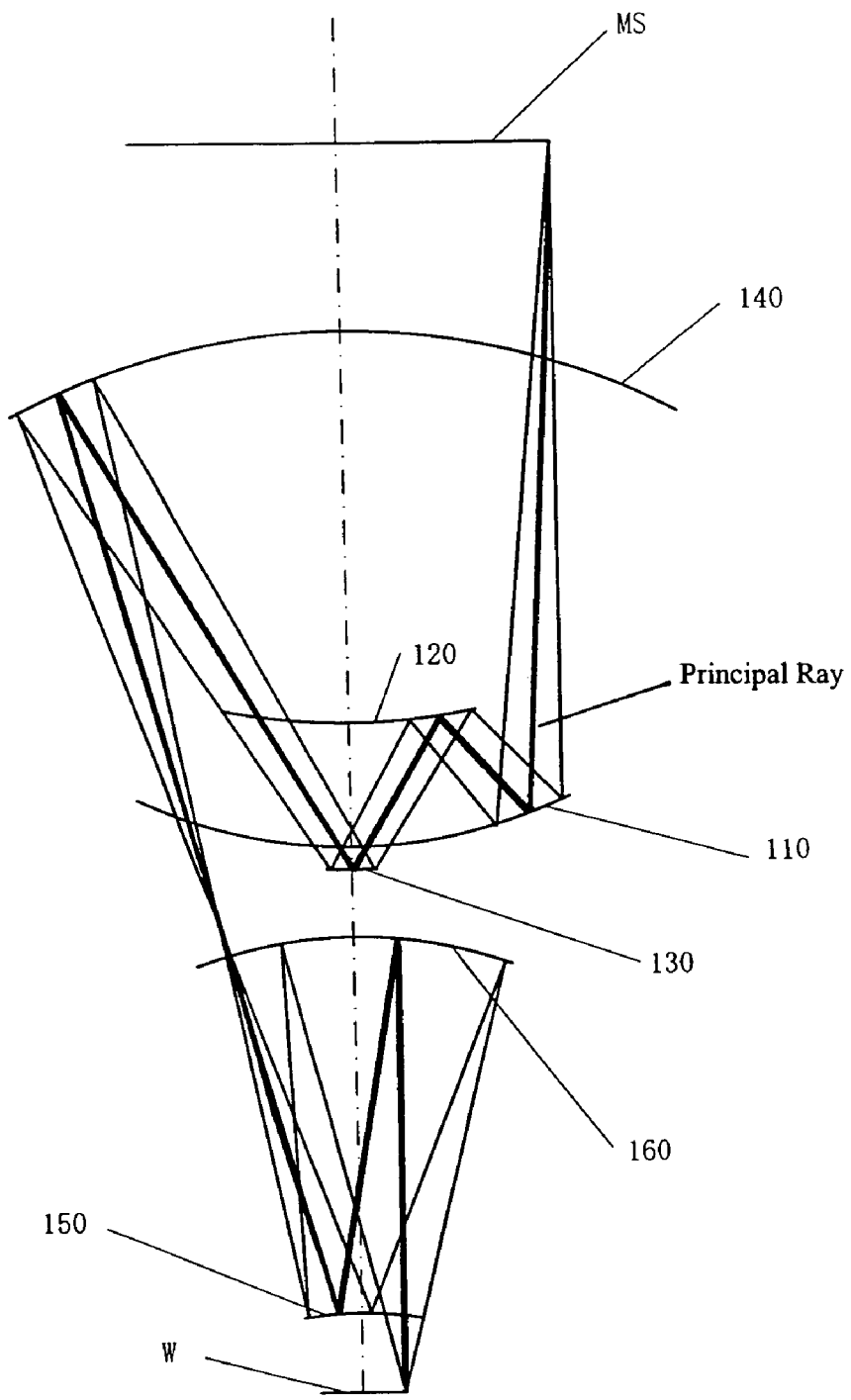
FIG. 2 is a schematic sectional view showing another shape of a catoptric reduction projection optical system as one aspect of the present invention shown in FIG. 1 and its optical path.
Figure 3:
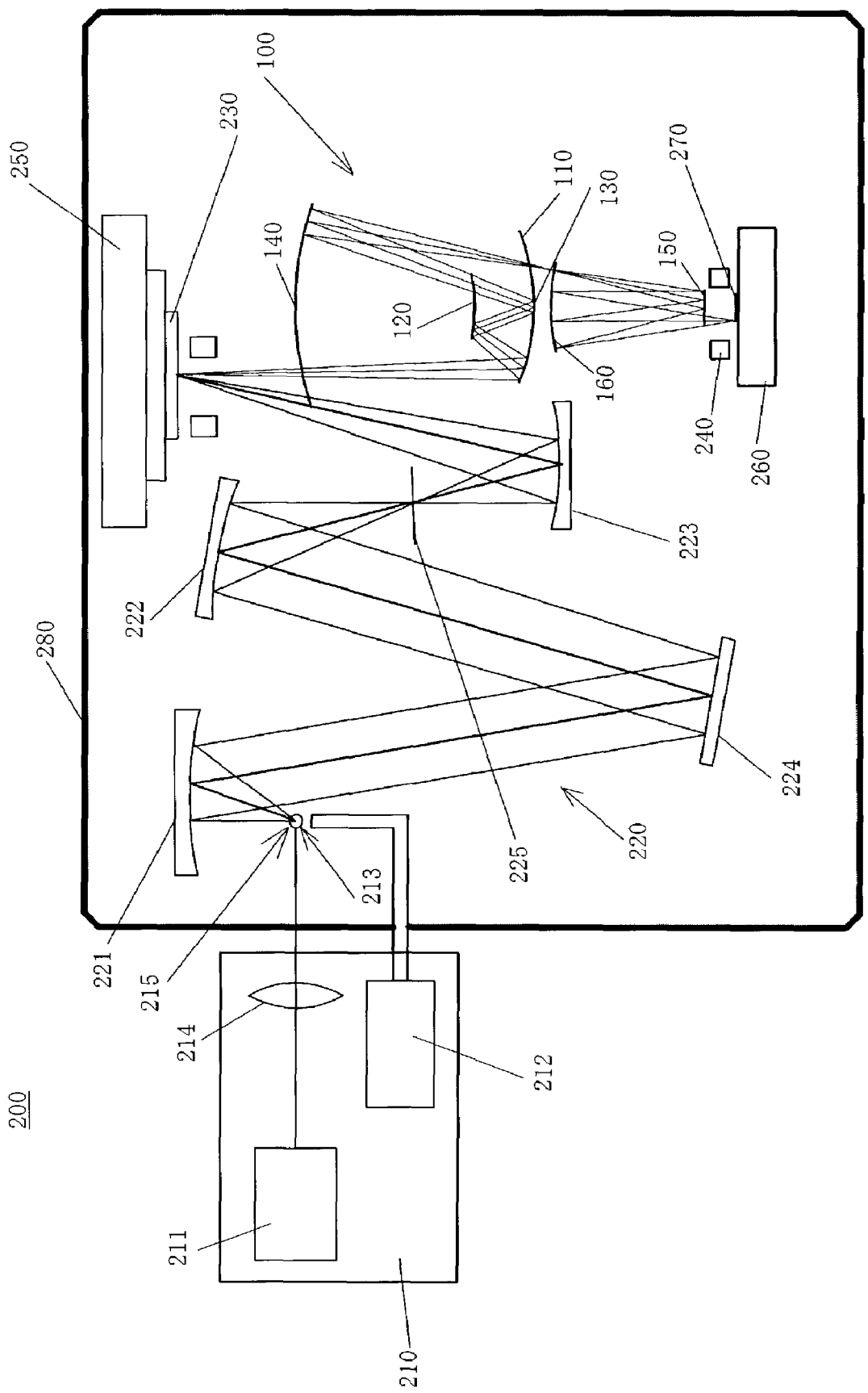
FIG. 3 is a schematic block diagram showing an exposure apparatus that includes a catoptric reduction projection optical system shown in FIG. 1.

A description will now be given of a catoptric reduction projection optical system 100 as one aspect and an exposure apparatus 200 as another aspect of the present invention by referring to accompanying drawings. The same reference numeral in each figure denotes the same element. Here, FIG. 1 is a schematic sectional view showing the shape of the catoptric reduction projection optical system 100 as one aspect of the present invention, and its optical path. FIG. 2 is a schematic sectional view showing a catoptric reduction projection optical systems 100a showing another shape of the catoptric reduction projection optical system 100 shown in FIG. 1, and its optical path. FIG. 3 is a schematic block diagram showing an exposure apparatus 200 that includes the catoptric reduction projection optical system 100 shown in FIG. 1. Unless otherwise specified, the catoptric reduction projection optical system 100 generalizes the catoptric reduction projection optical systems 100a.

Referring to FIG. 1, the inventive catoptric reduction projection optical system 100 (hereinafter simply called the projection optical system 100) demagnifies and projects a pattern on an object plane (MS) onto an image plane (W), thus being an optical system especially suitably applicable to the EUV light (with a wavelength of, for example, 13.4 nm). The projection optical system 100, which includes six mirrors, basically has, in order of reflecting light from the object plane (MS) side, a first mirror 110 (concave), a second mirror 120 (convex), a third mirror 130 (convex), a fourth mirror 140 (concave), and a fifth mirror 150 (convex), and a sixth mirror 160 (concave), wherein the third mirror 130 is located at an aperture stop. The inventive projection optical system 100 is basically arranged such that it forms a coaxial system, thus being a coaxial optical system that is axially symmetrical around one optical axis. Of course, for aberration correction or adjustment, the respective mirrors 110 to 160 of the projection optical system 100 need not necessarily be arranged such that they are perfectly coaxial, and they may be made slightly eccentric so as to improve the aberration. The mirrors 110 to 160 are adapted such that the projection optical system 100 uses four mirrors from the first mirror 110 to the fourth mirror 140 to form an intermediate image, which is image-formed afresh by two mirrors of the fifth mirror 150 and the sixth mirror 160 onto the image plane.

In such a structure, the inventive projection optical system 100 is a six-mirror system, and has an advantage of being desirable in increasing the NA. The projection optical system 100, whose third mirror is located at the aperture stop, can make the slant of the principal ray from the object plane (MS) small. In the present invention, the slant θ of the principal ray, from the object plane (MS), to a direction vertical to the object plane should preferably be less than 7.3°, more preferably 6° or less, and still more preferably 3° or less. In this way, the projection optical system has the slant of the principal ray from the object plane (MS) being less than 7.3°, i.e., it is an approximately telecentric optical system on the object side, thus obtaining a favorable imaging, since a change in image size is small even if the object plane (MS) shifts to the optical axis direction. Exit light on the image (W) side in the projection optical system 100 of the present invention is telecentric, and thus, even if the image (W) plane shifts to the optical axis direction, a fluctuation of magnification is small. The inventive projection optical system 100 is a telecentric optical system on its both sides, thus contributing to the stability of the imaging performance. The inventive projection optical system 100 prevents an interference of the light and mirror, which has been a problem in the conventional embodiment, from occurring (realizes an arrangement that hinders the interference), thus resolving the problem.

The projection optical system 100, which is arranged such that it is a coaxial system, can correct an aberration in a ring-shaped image plane with the optical axis as its center, thus having an advantage of being desirable. The projection optical system 100 is an optical system that forms an intermediate image, thus enabling a better-balanced excellent aberration correction. Since the mirror type of the projection optical system 100 can make the slant of the principal ray from the object plane (MS) small, it is an optical system that can cope with both a transmittance type mask (an aperture mask) and a catoptric mask.

The mirrors 110 to 160 are convex or concave mirrors as described above. In this embodiment, the mirrors 110 to 160 are not limited to the combination of the above convex and concave mirrors. However, so as to form an intermediate image by using the first mirror 110 to the fourth mirror 140 as in this embodiment, and form an image again by the fifth mirror 150 to the sixth mirror 160, the shapes of some mirrors will be settled by themselves. First, the fifth mirror 150 and the sixth mirror 160 are desirably convex and concave mirrors, respectively, since it is difficult for these mirrors to form an image while keeping a specific back focus at a high NA. The first mirror 110 is desirably a concave mirror since it reflects the principal ray from the object plane (MS) and brings it close to the optical axis. The fourth mirror 140 needs to reflect the EUV light reflected at the third mirror 130 and raise it to the optical axis direction, thus preferably being a concave mirror. The second mirror 120 and the third mirror 130 have freedom of choice between concave and convex mirrors, but as described later, the shapes of the mirrors should be determined so that the sum of the Petzval terms may be zero or in the neighborhood of zero.

In the present embodiment, as described above, the mirrors 110 to 160 are concave or convex mirrors, respectively, and their reflection surfaces have aspheric shapes. At least one or more mirrors out of the mirrors 110 to 160 preferably have an aspheric surface, but the aberration may be easily corrected by using aspheric surfaces for possible many mirrors (desirably, six mirrors). In these mirrors 110 to 160, the shape of the aspheric surface can be given by using the following equation that expresses a generic aspheric surface:

$$Z = \frac{ch^2}{1+\sqrt{1-(1+k)c^2h^2}} + Ah^4 + Bh^6 + Ch^8 + Dh^{10} + Eh^{12} + Fh^{14} + Gh^{16} + Hh^{18} + Jh^{20} + \ldots \quad (2)$$

where Z is the coordinate of the optical axis direction, c is the curvature (the reciprocal number of the radius r of curvature), h is a height from the optical axis, k a conic constant, A to J are aspheric coefficients of $4^{th}$ order, $6^{th}$ order, $8^{th}$ order, $10^{th}$ order, $12^{th}$ order, $14^{th}$ order, $16^{th}$ order, $18^{th}$ order, $20^{th}$ order, respectively.

The six mirrors 110 to 160 have the sum of the Petzval terms being in the neighborhood of zero or, desirably, zero in order to flatten the image (W) plane of the optical system. Namely, the sum of refractive power of each plane of the mirrors is in the neighborhood of zero. In other words, assuming that the radii of curvature for respective mirrors are $r_{110}$~$r_{160}$ (the subscripts correspond to the reference numerals of the mirrors), the mirrors 110~160 in this embodiment satisfy the following equation 3 or 4:

$$\frac{1}{r_{110}} - \frac{1}{r_{120}} + \frac{1}{r_{130}} - \frac{1}{r_{140}} + \frac{1}{r_{150}} - \frac{1}{r_{160}} = 0 \quad (3)$$

$$\frac{1}{r_{110}} - \frac{1}{r_{120}} + \frac{1}{r_{130}} - \frac{1}{r_{140}} + \frac{1}{r_{150}} - \frac{1}{r_{160}} \approx 0 \quad (4)$$

To the surface of the mirrors 110 to 160 is applied a multilayer film that reflects the EUV light, and such a multilayer film intensifies the light. A conceivable multilayer that is applicable to the mirrors 110~160 of the instant invention is, for example, a Mo/Si multilayer film created by reciprocally laminating a molybdenum (Mo) layer and a silicon (Si) layer onto a mirror's reflection surface or a Mo/Be multilayer film created by reciprocally laminating a molybdenum (Mo) layer and a beryllium (Be) layer onto a mirror's reflection surface. When a wave range near a wavelength of 13.4 nm is used, a mirror composed of a Mo/Si multilayer film can obtain a reflectance of 67.5%, and when a wave range near a wavelength of 11.3 nm is used, a mirror composed of a Mo/Be multilayer film can obtain a reflectance of 70.2%. However, the multilayer film according to the instant invention is not limited the above materials, thus not precluding use of a multilayer film that has an operation or effect similar to that of the above.

height of 75.about.87.5 mm, an image height of 15.about.17.5 mm and a width of 2.5 mm. Here, the numerical values (the radius of curvature, separations between planes, the coefficient of an aspheric surface, etc.) of the catoptric reduction projection optical system 100 shown in FIG. 1 are shown in Table 1.

TABLE 1

| Mirror No. | Radius of Curvature | Separation between Planes | Conic Constant k |
|---|---|---|---|
| Object Plane (MS) | ∞ | 448.232359 | 0.0 |
| Mirror 110 | −250.42968 | −75.473952 | 0.0 |
| Mirror 120 | −207.18578 | 75.855756 | 0.0 |
| Mirror 130 | 432.06576 | −300.381804 | 0.0 |
| Mirror 140 | 393.30067 | 511.764288 | 0.0 |
| Mirror 150 | 299.73289 | −191.302485 | 0.0 |
| Mirror 160 | 252.47769 | 231.385837 | 0.0 |
| Image Plane (W) | ∞ | — | — |

| Coefficient of Aspheric Surface | A | B | C | D |
|---|---|---|---|---|
| Mirror 110 | 0.314513E−8 | −0.363467E−14 | 0.895139E−17 | −0.158309E−20 |
| Mirror 120 | 0.335304E−7 | 0.660048E−12 | −0.12247E−14 | 0.782010E−18 |
| Mirror 130 | −0.148857E−7 | −0.248684E−10 | 0.938394E−13 | −0.533048E−18 |
| Mirror 140 | 0.203762E−9 | 0.659932E−15 | 0.146377E−18 | −0.507832E−23 |
| Mirror 150 | 0.571282E−7 | 0.271803E−11 | 0.198478E−14 | 0.123249E−16 |
| Mirror 160 | 0.685234E−9 | 0.125414E−13 | 0.244963E−18 | 0.117442E−21 |

| — | E | F | G | H |
|---|---|---|---|---|
| Mirror 110 | 0.173743E−24 | −0.103758E−28 | 0.260626E−33 | 0.000000E+00 |
| Mirror 120 | −0.113617E−21 | −0.843963E−25 | 0.291110E−28 | 0.000000E+00 |
| Mirror 130 | −0.394621E−23 | 0.485805E−30 | 0.570006E−31 | 0.000000E+00 |
| Mirror 140 | 0.206821E−28 | 0.542232E−32 | −0.127354E−36 | 0.000000E+00 |
| Mirror 150 | −0.321848E−19 | 0.396040E−22 | −0.177332E−25 | 0.000000E+00 |
| Mirror 160 | −0.774134E−25 | 0.208380E−28 | −0.202169E−32 | 0.000000E+00 |

As mentioned above, the third mirror 130 is located at an aperture stop. Therefore, an aperture stop or a variable aperture stop may be arranged near the third mirror 130 so as to limit or make variable the NA. Use of a variable stop will advantageously realize a deeper DOF, thereby further stabilizing an image.

Here, a description will be given of an experiment result of illumination by using the catoptric reduction projection optical systems 100 and 100a of the present invention. In FIGS. 1 and 2, MS denotes a catoptric mask located at the position of the object plane, and W denotes a wafer located at the position of the image plane. In the catoptric reduction projection optical systems 100 and 100a, the mask MS is illuminated by an illumination system (not shown) that emits EUV light with a wavelength of 13.4 nm or so, and the reflected EUV light from the mask MS is in turn reflected by the 1.sup.st mirror 110 (concave mirror), 2.sup.nd mirror 120 (convex mirror), 3.sup.rd mirror 130 (convex mirror), 4.sup.th. mirror 140 (concave mirror), 5th mirror 150 (convex mirror), and 6th mirror 160 (concave mirror) in this sequence, and a demagnified image of the mask pattern is formed on the wafer W located at the position of the image plane. Further, the catoptric reduction projection optical system 100 shown in FIG. 1 has NA=0.15, and reduction=⅕, and a circular arc shaped image plane with an object Aberrations (calculated at several points of the image height) of the catoptric reduction projection optical system 100 shown in FIG. 1, which do not include errors of manufacture, are wave aberration=0.005 .lambda.rms, and distortion aberration=.+−0.2 nm, and this is an optical system that is diffraction limited at a wavelength of 13.4 nm.

As described above, the catoptric reduction projection optical system 100 of the instant invention, which has a small slant .theta. of the principal ray from the object plane (MS), indicates the values as shown in table 2 below.

TABLE 2

| Image height mm | Principal Ray Angle θ (°) | Tangent of Principal Ray Angle |
|---|---|---|
| 75.0 | 1.05 | 0.0183 |
| 87.0 | 1.02 | 0.0179 |

From the above table, it will be understood that even if the object plane (MS) shifts in the optical axis direction, the catoptric reduction projection optical system 100 of the present invention can obtain an excellent imaging since fluctuation in image size is small.

On the other hand, the catoptric reduction projection optical system 100a shown in FIG. 2 has NA=0.25, and reduction=⅕, and a circular arc shaped image plane with an object height of 108.about.116 mm, an image height of 21.6.about.23.2 mm and a width of 1.6 mm. Here, the numerical values (the radius of curvature, separations between planes, the coefficient of an aspheric surface, etc.) of the catoptric reduction projection optical system 100a shown in FIG. 2 are shown in Table 3.

TABLE 3

| Mirror No. | Radius of Curvature | Separation between Planes | Conic Constant k |
|---|---|---|---|
| Object Plane (MS) | ∞ | 383.187768 | — |
| Mirror 110 | −264.16165 | −67.483770 | −0.235670 |
| Mirror 120 | −346.49706 | 79.358491 | −3.012105 |
| Mirror 130 | 304.06055 | −291.791119 | 16.703453 |
| Mirror 140 | 390.88999 | 533.716811 | −0.022743 |
| Mirror 150 | 260.43391 | −204.510360 | 3.951385 |
| Mirror 160 | 265.64128 | 248.187943 | −0.006541 |
| Image Plane (W) | ∞ | — | — |

| Coefficient of Aspheric Surface | A | B | C | D |
|---|---|---|---|---|
| Mirror 110 | 0.659314E−8 | 0.713030E−13 | 0.109746E−16 | −0.193751E−20 |
| Mirror 120 | 0.101259E−6 | −0.731248E−11 | −0.298158−15 | 0.259782E−18 |
| Mirror 130 | −0.240179E−6 | −0.178735E−9 | 0.840949E−11 | −0.174832E−12 |
| Mirror 140 | 0.125251E−10 | −0.281198E−14 | 0.182272E−18 | −0.501337E−23 |
| Mirror 150 | 0.876743E−7 | −0.696971E−12 | −0.119131E−14 | 0.137248E−16 |
| Mirror 160 | 0.7000772E−9 | 0.135427E−13 | −0.214540E−17 | 0.143191E−20 |

| — | E | F | G | H |
|---|---|---|---|---|
| Mirror 110 | 0.166111E−24 | −0.737842E−29 | 0.168974E−33 | −0.285284E−38 |
| Mirror 120 | −0.225429E−22 | −0.120945E−25 | 0.414314E−29 | −0.536485E−33 |
| Mirror 130 | 0.188081E−14 | −0.957507E−17 | 0.650067E−20 | 0.133530E−21 |
| Mirror 140 | 0.385780E−28 | −0.155596E−33 | 0.557000E−37 | −0.179456E−41 |
| Mirror 150 | −0.512578E−19 | 0.106135E−21 | −0.124838E−24 | 0.782238E−28 |
| Mirror 160 | −0.527674E−25 | 0.119304E−27 | −0.161836E−31 | 0.120939E−35 |

| — | J |
|---|---|
| Mirror 110 | 0.605944E−43 |
| Mirror 120 | 0.265163E−37 |
| Mirror 130 | −0.388827E−24 |
| Mirror 140 | 0.165325E−46 |
| Mirror 150 | −0.203027E−31 |
| Mirror 160 | −0.382716E−40 |

Aberrations (calculated at several points of the image height) of the catoptric reduction projection optical system 100a shown in FIG. 2, which do not include errors of manufacture, are wave aberration=0.056 .lambda.rms, and distortion aberration=.+−0.4 nm, thus being an optical system that is diffraction limited at a wavelength of 13.4 nm.

Similar to the catoptric reduction projection optical system 100, the catoptric reduction projection optical system 100a, which has a small slant .theta. of the principal ray from the object plane (MS), indicates the values as shown in table 2 below.

TABLE 4

| Image height mm | Principal Ray Angle θ (°) | Tangent of Principal Ray Angle |
|---|---|---|
| 108 | 2.75 | 0.0481 |
| 112 | 2.83 | 0.0494 |
| 116 | 2.91 | 0.0508 |

From the above table, it will be understood that even if the object plane (MS) shifts in the optical axis direction, the catoptric reduction projection optical system 100 of the present invention can obtain an excellent imaging since fluctuation in image size is small.

As described above, the catoptric reduction projection optical system 100 uses a wavelength of EUV to achieve a diffraction limited performance at a comparatively high NA, and this is a reflection optical system having little likelihood of an interference between a mirror and light. Further, since the slant of the principal ray from the object side is small, an excellent imaging can be obtained.

A description will be given below of an exposure apparatus 200 to which the catoptric reduction projection optical system 100 of the present invention is applied. The exposure apparatus 200 according to the present invention uses, as illumination light for exposure, an EUV ray (with a wavelength of, e.g., 13.4 nm). The image plane of the exposure apparatus 200 is an arc-shaped (ring-shaped) image plane, and adopts a method of scanning the reticle 230 and the wafer at the speed ratio of the reduction ratio to expose the whole area of the reticle 230. To reference FIG. 3, the exposure apparatus 200 includes an EUV light source 210, an illumination optical system 220, a catoptric reticle 230, an alignment optical system 240, the projection optical system 100, a reticle stage 250, a wafer stage 260, and the wafer 270. Since the EUV light has low transmittance for air, at least the optical path through which the EUV light travels should desirably be in a vacuum atmosphere, so that the area from the illumination optical system 220 to the wafer stage 260 is housed in a vacuum chamber 280.

The EUV light source 210 according to the present embodiment, uses, for example, a laser plasma light source. The laser plasma light source 210, which is supplied by a target feed unit 212, irradiates a highly intensified pulse laser beam from the pulse laser 211 to the target material 213 put in the vacuum chamber 280 via a condensing lens 214, thus generating a high-temperature plasma 215. And an EUV ray with a wavelength of about 13.4 nm emitted from this is utilized. The target material 213, for which a metallic thin film, an inert gas, a droplet, etc. are used, is supplied into the vacuum chamber 280 by the target feed unit 212 such as a gas jet. In order to raise an average intensity of the emitted EUV ray, a repeated frequency of the pulse laser 211 should be preferably high, and is operated by the repeated frequency of an ordinary number kHz. Or also used is a discharge plasma light source, which emits gas around the electrode put in the vacuum chamber 280, applies pulse voltage to the electrode, discharges electricity, generates high temperature plasma, and uses an EUV ray, for example, with a wavelength of about 13.4 nm emitted from this.

The illumination optical system 220 propagates EUV rays, thus illuminating a mask or a reticle 230 (these terms are used interchangeably in this application). In FIG. 3, the illumination optical system 220 includes the first to third mirrors 221, 222, and 223, an optical integrator 224, and an aperture 225. The first mirror 221 condenses EUV rays emitted almost isotropically from the plasma 215. The optical integrator 224 uniformly illuminates the reticle 230 using a specified aperture. Further, these EUV rays are relayed to the reticle 230 by the second to third mirrors 222~223. The aperture 225 is arranged in a position conjugate with the reticle 230 of the illumination optical system 220, and limits the illuminated area on the reticle 230 plane to a circular arc shape or an oblong shape.

Incidentally, a debris eliminating unit (not shown) may be arranged between a light emitting point and the optical system, and thus, debris generated concurrently when the EUV rays are produced is eliminated by the debris eliminating unit.

The projection optical system 100 includes, in order of reflecting light from the reticle 230 side, the 1sup.st mirror 110 (concave mirror), 2.sup.nd mirror 120 (convex mirror), 3.sup.rd mirror 130 (convex mirror), 4.sup.th mirror 140 (concave mirror), 5.sup.th mirror 150 (convex mirror), and 6.sup.th mirror 160 (concave mirror), wherein the 3.sup.rd mirror 130 is located at the position of the aperture stop. The catoptric reduction projection optical system 100 is adapted as above, and thus, a detailed description is omitted here.

The reticle stage 250 and the wafer stage 260 have a mechanism that scans synchronously at the speed ratio in proportion to the reduction ratio. Here, it is assumed that a scanning direction in the reticle 230 or wafer 270 plane is X, a direction vertical to it is Y. and a direction vertical to the reticle 230 or the wafer 270 plane is Z.

A desired pattern is created onto the reticle 230, which is held by a reticle chuck (not shown) located above the reticle stage 250. The reticle stage 250 has a mechanism that moves in the direction X. It also has a fine adjustment in the directions X, Y, and Z, plus in a direction of rotation around each axis, thus being able to position the reticle 230. The position and posture of the reticle stage 250 is measured by a laser interferometer, and based on this result, its position and posture are controlled. Although the reticle 230 is realized as a catoptric reticle in this embodiment, the projection optical system 100 can make small the slant of the principal ray from the reticle 230, and thus, either one of a transmittance type reticle and a catoptric reticle is applicable.

The wafer 270 is held to the wafer stage 260 by a wafer chuck (not shown). Like the reticle stage 250, the wafer stage 260 has a mechanism that moves in the direction X. It also has a fine adjustment in the directions X, Y, and Z, and in a direction of rotation around each axis, thus being able to position the wafer 270. The position and posture of the wafer stage 260 is measured by a laser interferometer, and based on this result, its position and posture are controlled.

An alignment detection optical system 240 measures the positional relationship between the position of the reticle 230 and the optical axis of the projection optical system 100, and sets positions and angles of the reticle stage 250 and the wafer stage 260 so that a projected image of the reticle 230 may be consistent with a specified position of the wafer 270. Further, a focus position on the wafer 270 plane in the direction Z is measured by a focus detection optical system (not shown), and by controlling the position and the angle of the wafer stage 260, the wafer plane is always kept at a position where the projection optical system 100 can form an image during exposure.

When a one-time scan exposure is finished on the wafer 270, the wafer stage 260 moves stepwise in the directions X and Y to the next start position for scanning and exposure, and the reticle stage 250 and the wafer stage 260 synchronously scan in the direction X at a speed ratio in proportion to the reduction ratio of the projection optical system.

In this way, while the demagnified, projected image of the reticle 230 is formed on the wafer 270, an operation of synchronously scanning the two is repeated (step-and-scan manner). Thus, a transferred pattern on the reticle 230 is transferred onto the whole area of the wafer 270.

In order to prevent the EUV rays from being absorbed by the gas, and carbons and other molecules from adhering to the space where the optical element irradiating the EUV rays is located, the space where the EUV rays of light are propagated and the space where the optical element is located need to be kept under a fixed pressure or lower. The light source, the illumination optical system 220, optical elements of the projection optical system 100, the reticle 230, the wafer 270, etc. are housed in the vacuum chamber 280, which is exhausted of air so as to meet a vacuum state.

At the time of exposure, EUV rays emitted from the illumination apparatus 100 illuminate the mask MS, and form a pattern image on the mask MS onto the plane of the object W. In the present embodiment, the image plane is an arc-shaped (ring-shaped) image plane, and the whole area of the mask can be exposed by scanning the mask and wafer at the speed ratio of the reduction ratio.

The light source section of the exposure apparatus is not limited only to the present embodiment. For example, the light source section may use a Z pinch method that is one of discharge methods, a plasma focus, a capillary discharge, hollow cathode triggered Z pinch, etc.

Figure 4:
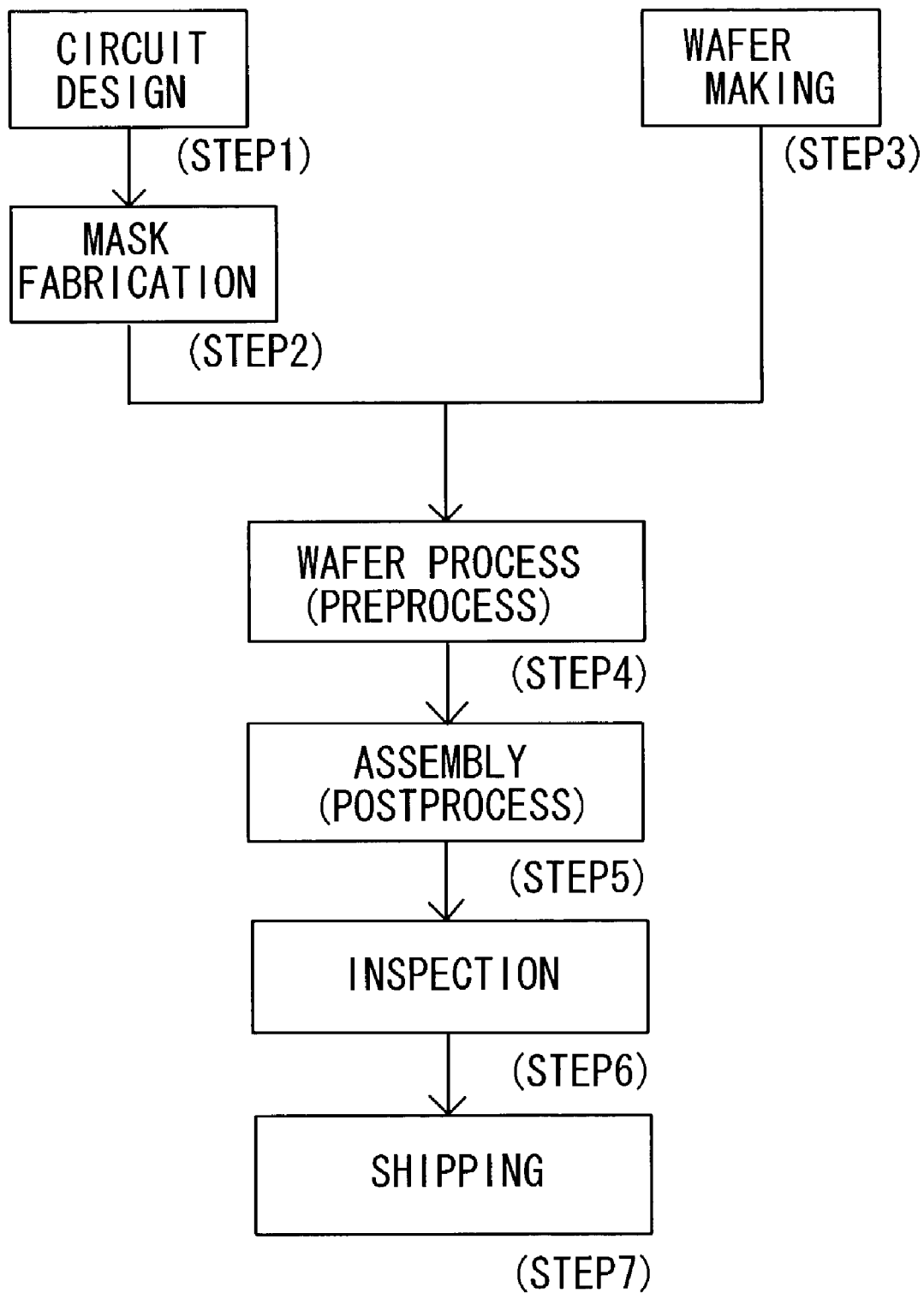
FIG. 4 is a flowchart for explaining a fabrication of devices (semiconductor chips such as ICs, LSIs, and the like, LCDs, CCDs, etc.).
Figure 5:
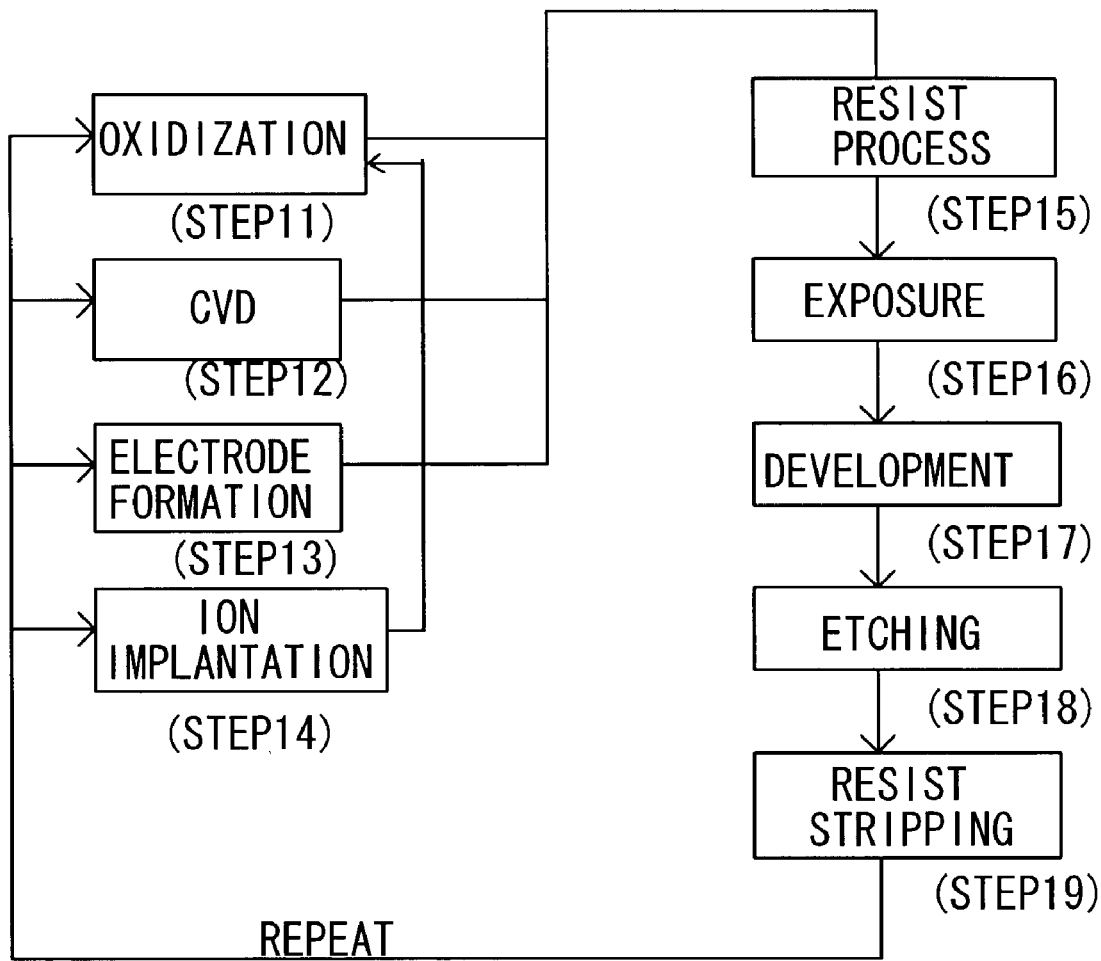
FIG. 5 is a detailed flowchart for Step 4 of wafer process shown in FIG. 4.

Referring to FIGS. 4 and 5, a description will now be given of an embodiment of a device fabricating method using the above mentioned exposure apparatus 200. FIG. 4 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 5 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer.

So far, a description has been given of the preferred embodiments according to the present invention. However, the present invention is not limited to these preferred embodiments, and various variations and modifications may be made without departing from the spirit and scope of the present invention. Further, this invention can be applied to a catoptric reduction projection optical system for non-EUV ultraviolet rays with a wavelength of 200 nm or less such as ArF excimer laser and F.sub.2 excimer laser, as well as to an exposure apparatus that scans and exposes large image planes, and to an exposure apparatus that does or does not scan and expose large image planes.

According to the catoptric reduction projection optical system and exposure apparatus of the present invention, use of a six-mirror system can make the NA large, and the slant of the principal ray from the object plane small since the 3.sup.rd mirror is located at the pupil position (at the position of the aperture stop). Further, such an optical system can make it difficult for the interference between a ray and a mirror, i.e., vignetting to occur. Hereby, the catoptric reduction projection optical system of the instant invention can achieve an optical system with a high NA, excellent in an imaging performance since a change in image size is small even if the object plane shifts to the optical axis direction while the interference between a ray and a mirror can be prevented. Therefore, an exposure apparatus using such a catoptric reduction projection optical system can provide high quality devices with excellent exposure performances such as throughput.

What is claimed is:

1. A catoptric reduction projection optical system for imaging a reduced size of a pattern formed on an object plane onto an image plane using a light with a wavelength of 200 nm or less, said optical system comprising:
   a first mirror for reflecting the light from the object plane;
   a second mirror including a convex reflection surface that reflects the light reflected by the first mirror;
   a third mirror for reflecting the light reflected by the second mirror;
   a fourth mirror for reflecting the light reflected by the third mirror;
   a fifth mirror for reflecting the light reflected by the fourth mirror; and
   a sixth mirror for reflecting the light reflected by the fifth mirror and introducing onto the image plane,
   wherein said first to sixth mirrors substantially form a coaxial system for a predetermined optical axis,
   wherein an inclination to a normal of the object plane, of a principal ray from the pattern to the first mirror is less than 3 degrees.

2. A catoptric reduction projection optical system according to claim 1, wherein a transmission type mask is disposed on the object plane.

3. A catoptric reduction projection optical system according to claim 1, wherein said third mirror is disposed on a pupil of the projection optical system.

4. A catoptric reduction projection optical system according to claim 1, wherein said first mirror includes a concave reflection surface, wherein said third mirror includes a convex reflection surface, wherein said fourth mirror includes a concave reflection surface, wherein said fifth mirror includes a convex reflection surface, wherein said sixth mirror includes a concave reflection surface.

5. A catoptric reduction projection optical system according to claim 4, wherein an absolute value of curvature radius of the concave reflection surface of the first mirror is 250.42968 mm or more and 264.16165 mm or less.

6. A catoptric reduction projection optical system according to claim 1, wherein an absolute value of curvature radius of the convex reflection surface of the second mirror is 207.18578 mm or more and 346.49706 mm or less.

7. A catoptric reduction projection optical system according to claim 1, an outside edge part of a fourth mirror illumination area is farthest away from the predetermined optical axis among outside edge parts of the fourth and sixth mirror illumination area and a first, second, third and fifth mirror illumination area, where the first mirror illumination area is an area of the first mirror illuminated by the light from the object plane, the second mirror illumination area is an area of the second mirror illuminated by the light from the object plane, the third mirror illumination area is an area of the third mirror illuminated by the light from the object plane, the fourth mirror illumination area is an area of the fourth mirror illuminated by the light from the object plane, the fifth mirror illumination area is an area of the fifth mirror illuminated by the light from the object plane, and the sixth mirror illumination area is an area of the sixth mirror illuminated by the light form the object plane.

8. An exposure apparatus comprising:
   an illumination optical system for illuminating a pattern of a mask using a light with a wavelength of 200 nm or less from a light source; and
   a projection optical system for projecting a reduced size of the pattern onto an object,
   wherein said projection optical system comprising:
   a first mirror for reflecting the light form the pattern;
   a second mirror including a convex reflection surface that reflects the light reflected by the first mirror;
   a third mirror for reflecting the light reflected by the second mirror;
   a fourth mirror for reflecting the light reflected by the third mirror;
   a fifth mirror for reflecting the light reflected by the fourth mirror; and
   a sixth mirror for reflecting the light reflected by the fifth mirror and introducing onto the object,
   wherein said first to sixth mirror substantially form a coaxial system for a predetermined optical axis, wherein an inclination to a normal of the mask, of a principal ray from the pattern to the first mirror is less than 3 degrees.

9. A device fabricating method comprising the steps of: exposing a substrate using an exposure apparatus according to claim 8; and developing the substrate exposed.

10. A catoptric reduction projection optical system for imaging a reduced size of a pattern formed on an object plane onto an image plane using a light with a wavelength of 200 nm or less, said optical system comprising:
- a first mirror for reflecting the light from the object plane;
- a second mirror for reflecting the light reflected by the first mirror;
- a third mirror for reflecting the light reflected by the second mirror; a fourth mirror for reflecting the light reflected by the third mirror;
- a fifth mirror for reflecting the light reflected by the fourth mirror; and
- a sixth mirror for reflecting the light reflected by the fifth mirror and introducing onto the object plane,
- wherein said first to sixth mirrors substantially form a coaxial system for a predetermined optical axis,
- wherein an inclination to a normal of the object plane, of a principal ray from the pattern to the first minor is less than 3 degrees,
- wherein said third mirror is disposed on a pupil of the projection optical system.

11. An exposure apparatus comprising:
- an illumination optical system for illuminating a pattern of a mask using a light with a wavelength of 200 nm or less from a light source; and
- a projection optical system for projecting a reduced size of the pattern onto an object,
- wherein said projection optical system comprising:
- a first mirror for reflecting the light from the pattern;
- a second mirror for reflecting the light reflected by the first mirror; a third mirror for reflecting the light reflected by the second mirror; a fourth mirror for reflecting the light reflected by the third mirror;
- a fifth mirror for reflecting the light reflected by the fourth mirror; and a sixth mirror for reflecting the light reflected by the fifth mirror and
- introducing onto the object,
- wherein said first to sixth mirrors substantially form a coaxial system for a predetermined optical axis,
- wherein an inclination to a normal of the mask, of a principal ray from the pattern to the first mirror is less than 3 degrees,
- wherein said third mirror is disposed on a pupil of the projection optical system.

12. A device fabricating method comprising the steps of: exposing a substrate using an exposure apparatus according to claim 11; and developing the substrate exposed.

13. A catoptric reduction projection optical system for imaging a reduced size of a pattern of a mask onto an image plane using a light with a wavelength of 200 nm or less, said optical system comprising:
- a first mirror for reflecting the light from the pattern;
- a second mirror for reflecting the light reflected by the first mirror; a third mirror for reflecting the light reflected by the second mirror;
- a fourth mirror for reflecting the light reflected by the third mirror; a fifth mirror for reflecting the light reflected by the fourth mirror;
- a six mirror for reflecting the light reflected by the fifth mirror and introducing onto the image plane,
- wherein said first to sixth mirrors substantially form a coaxial system for a predetermined optical axis,
- wherein an inclination to a normal of the mask, of a principal ray from the pattern to the first mirror is less than 3 degrees,
- wherein said mask is a transmission type mask.

14. An exposure apparatus comprising:
- an illumination optical system for illuminating a pattern of a mask using a light with a wavelength of 200 nm or less from a light source; and
- a projection optical system for projecting a reduced size of the pattern onto an object,
- wherein said projection optical system comprising:
- a first mirror for reflecting the light from the pattern;
- a second mirror for reflecting the light reflected by the first mirror, a third mirror for reflecting the light reflected by the second mirror; a fourth mirror for reflecting the light reflected by the third mirror;
- a fifth mirror for reflecting the light reflected by the fourth mirror; and a sixth mirror for reflecting the light reflected by the fifth mirror and introducing onto the object,
- wherein said first to sixth mirrors substantially form a coaxial system for a predetermined optical axis,
- wherein an inclination to a normal of the mask, of a principal ray from the pattern to the first mirror is less than 3 degrees,
- wherein said mask is a transmission type mask.

15. A device fabricating method comprising the steps of: exposing a substrate using an exposure apparatus according to claim 14; and developing the substrate exposed.

* * * * *

UNITED STATES PATENT AND TRADEMARK OFFICE
CERTIFICATE OF CORRECTION

| | | |
|---|---|---|
| PATENT NO. | : 7,232,233 B2 | Page 1 of 1 |
| APPLICATION NO. | : 10/207938 | |
| DATED | : June 19, 2007 | |
| INVENTOR(S) | : Suzuki et al. | |

It is certified that error appears in the above-identified patent and that said Letters Patent is hereby corrected as shown below:

In the Claims:

In Claim 7, (col. 14, line 31), please replace "predetennined" with --predetermined--.

Signed and Sealed this

Fourteenth Day of August, 2007

JON W. DUDAS
*Director of the United States Patent and Trademark Office*